United States Patent [19]

Timmons et al.

[11] Patent Number: 5,381,115
[45] Date of Patent: Jan. 10, 1995

[54] METHOD AND APPARATUS FOR REGULATING OUTPUT POWER OF SIGNAL AMPLIFIER

[75] Inventors: Richard P. Timmons, Forest, Va.; Lanh T. Trinh, Carlsbad, Calif.

[73] Assignee: Hughes Aircraft Company, Los Angeles, Calif.

[21] Appl. No.: 114,794

[22] Filed: Aug. 30, 1993

[51] Int. Cl.$^6$ .............................................. H03G 3/10
[52] U.S. Cl. .................................. 330/279; 330/284; 330/289; 330/129; 455/126
[58] Field of Search ............. 330/279, 284, 289, 129; 455/126, 127

[56] References Cited

U.S. PATENT DOCUMENTS 5,245,297  9/1993  Claydon et al. .................. 330/129

FOREIGN PATENT DOCUMENTS 0154614  6/1989  Japan ................................. 330/279

Primary Examiner—James B. Mullins
Assistant Examiner—James A. Dudek
Attorney, Agent, or Firm—Phyllis Y. Price; Terje Gudmestad; Wanda K. Denson-Low

[57] ABSTRACT

A method and apparatus for controlling the output power level of an amplifier that is highly insensitive to temperature variations. The method intentionally shuts down the amplifier for a very short period of time in order to reveal the detector diode's thermally induced error voltage. This voltage is then stored for a subsequent subtraction from the total detected voltage after the amplifier is turned back on. The detector diode is therefore compensated against itself to obtain a higher level of detection accuracy.

8 Claims, 5 Drawing Sheets

METHOD AND APPARATUS FOR REGULATING OUTPUT POWER OF SIGNAL AMPLIFIER

BACKGROUND OF THE INVENTION

Field of the Invention

The present invention generally relates to land-mobile voice and data communications, such as in a cellular and personal communication systems, and more particularly to circuitry to control the power level of mobile units.

Description of the Prior Art

Signal amplifiers in general, and RF amplifiers for land-mobile applications in particular, are generally controlled to provide a power output at one of several predetermined signal levels. Such controls are generally required by administrative agency regulations which are expected to become more stringent in the future. A basic and crude way to achieve output power level control is illustrated in FIG. 1, for the example of an RF amplifier 10. The RF input signal is applied to the amplifier 10 via an adjustable attenuator 11 (or a variable gain amplifier). The output of the amplifier is sampled by means of a directional coupler 12 and detected by a Schottky diode 13, the output of which provides a measure of the output level of the amplifier 10. The diode detector 13 is essentially a current rectifier that transforms a small portion of the AC voltage at the output of the amplifier (via the coupler 12) into a DC voltage that is proportional to the output power of the amplifier. This detected voltage is then compared in comparator 14 against a set point voltage representing the desired output power. The output of the comparator 14 then drives the signal attenuator 11 (or variable gain amplifier) to adjust the overall gain of the amplification and thereby the output power level of the amplifier 10. Thus, this negative feedback control system acts as a servo mechanism in such a way that the feedback voltage from the diode detector 13 will equal the set point control voltage so that the output power level of the amplifier 10 is adjusted to a desired level.

The problem with the basic circuit shown in FIG. 1 is that the output power metering element, the Schottky diode detector 13, is temperature dependent such that the detected voltage will vary with the ambient temperature at a rate of about 2 millivolts per degree Celsius. When the amplifier 10 is set to generate a very low output power level and under extreme temperature conditions, the detected voltage will be very small, and a large temperature induced voltage can significantly fool the voltage detection causing a false reading of the output power. The control loop will act on this false reading and produce an incorrect output power level.

To remedy the above problem, another conventional technique uses a second diode whose electrical characteristics precisely match those of the detecting diode. The second diode is normally placed in thermal proximity of the detecting diode so that it will develop a similar thermally induced voltage. The second diode's function is not to rectify (or detect) the RF power from the amplifier but, rather, merely to produce a thermally generated voltage that will be subtracted from the main detector voltage (using a voltage subtracting circuit) leaving only the true power indicating voltage. An example is shown in U.S. Pat. No. 4,523,155 to Walczak et al. which discloses a temperature compensated automatic output control circuitry for power amplifiers which uses matched diode temperature compensation.

This technique works better than the one described above wherein only a single diode is used but still suffers from a number of shortcomings. First, a matched diode pair is expensive, and often the pair must be hand selected from a batch of diodes for close matching of temperature characteristics. Second, since diode detectors are typically biased with a small DC current to improve their sensitivity, each diode in the diode pair is biased with the same amount of DC current and separated by an RF isolation network, with the simplest being an RF choke. Here, a problem arises, especially at higher RF frequencies, that some RF energy will "leak" from the main detecting diode to the compensator diode (i.e., the second diode) causing some AC rectification to take place in it where only DC current is supposed to exist. This RF leakage compromises the effectiveness of the dual diode scheme.

SUMMARY OF THE INVENTION

It is therefore an object of the present invention to provide a power level control circuit for the power amplifier of a land-mobile unit which, on the one hand, does not require a matched diode pair while, on the other hand, is simple in design, resulting in economies of manufacture.

According to the invention, there is provided a method and apparatus for controlling the output power level of an amplifier that is highly insensitive to temperature variations. The method intentionally shuts down the amplifier for a very short period of time in order to reveal the detector diode's thermally induced error voltage. This voltage is then stored for a subsequent subtraction from the total-detected voltage after the amplifier is turned back on. The detector diode is therefore compensated against itself to obtain a higher level of detection accuracy.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 2:
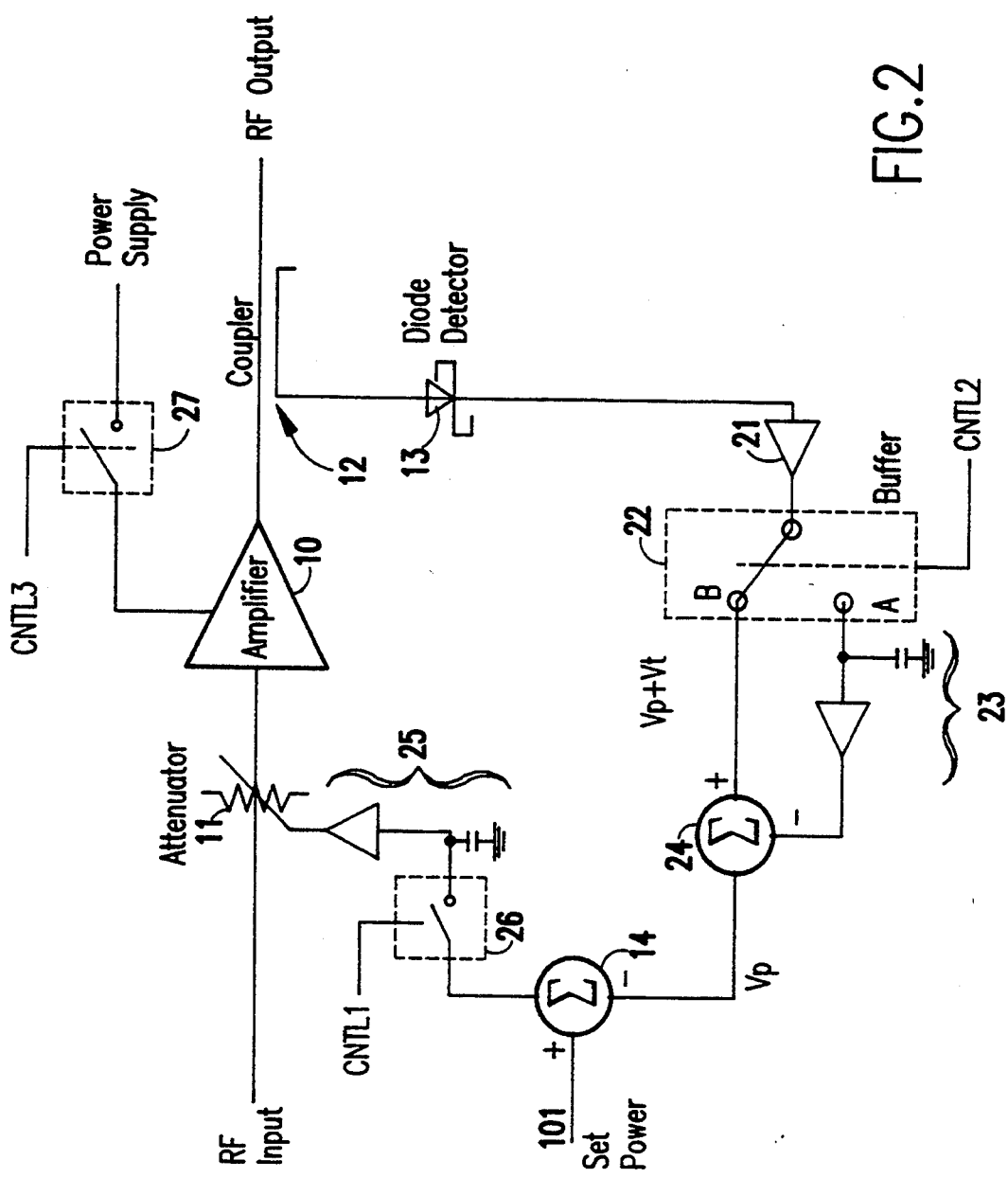
FIG. 2 is a block diagram of a first embodiment of the power level control circuit of an RF signal amplifier according to the invention.

Referring again to the drawings, and more particularly to FIG. 2, there is shown a block diagram of the first embodiment of the invention. Only a single diode detector is used. As a result, its output will comprise both the true power indicating voltage and the thermally related spurious voltage. The true power indicating voltage will be referred to hereafter as $V_p$, and the thermally borne voltage as $V_t$.

Figure 1:
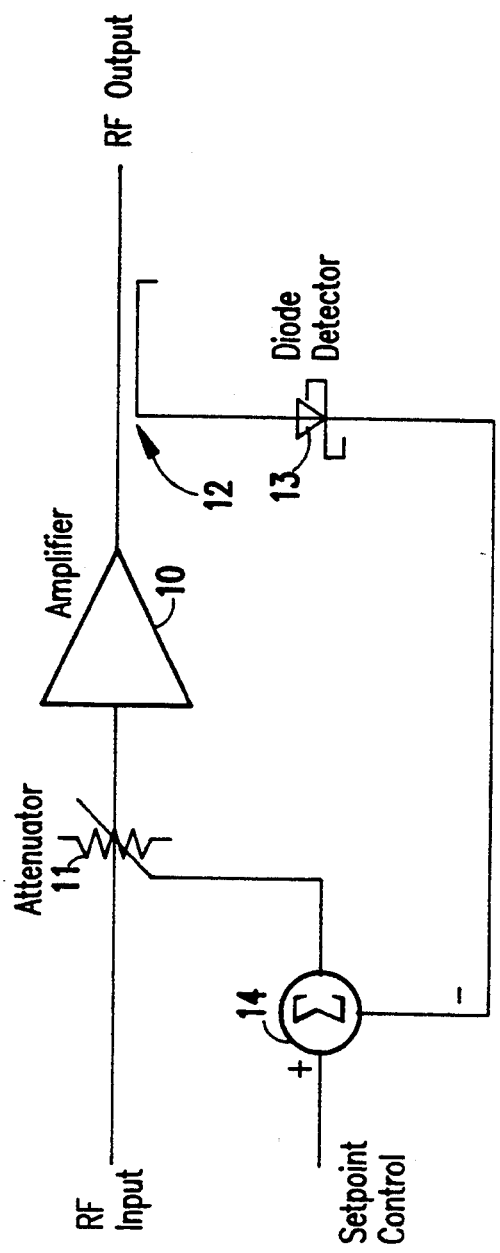
FIG. 1 is a block diagram of a conventional power level control circuit for an RF signal amplifier used in land-mobile applications.

As in the conventional control circuit shown in FIG. 1, the amplifier 10 receives its input from adjustable attenuator 11 (or, alternatively, a variable gain preamplifier), and the output of the amplifier is sampled by directional coupler 12 and detected by Schottky diode 13. The detected DC voltage is supplied via an isolation buffer amplifier 21 to an electronic switch 22, here represented as a DPST switch having two outputs denoted as A and B. The A output is supplied to a sample-and-hold (S/H) circuit 23, the output of which is supplied to the negative input of a summing junction 24. The B output of switch 22 is supplied directly to the positive input of the summing junction 24. The output of the summing junction is input to the comparator 14 that receives the setpoint control voltage 101. The output of comparator 14, however, does not drive the adjustable attenuator 11 but is sampled by a second S/H circuit 25 through switch 26, and it is the output of the S/H circuit 25 that drives attenuator 11.

The operation of the thermally stable amplifier circuit operates as follows. Before the amplifier 10 is first powered up via the power supply switch 27, the electronic switch 22 is set to output position A momentarily to transfer a voltage $V_t$ into the S/H circuit 23. Notice that since the amplifier 10 is not yet on, only $V_t$ exists at the detector diode 13. The output of S/H circuit 23 will hold the voltage $V_t$ even when switch 22 is positioned back to output position B. The amplifier 10 is now commanded to turn on by setting electronic switch 22 to output position B and closing the power supply switch 27, and the diode detector immediately produces a voltage equal to $V_p$ plus $V_t$. The summing circuit 24 then subtracts $V_t$, which has been held constant by S/H circuit 23, from $V_p$ plus $V_t$ which is output at B of switch 22, leaving only $V_p$ which is the true power indicating voltage. The voltage $V_p$ is then compared in comparator 14 against the set point voltage to produce a loop error voltage which is used to steer the gain of the amplifier by means of the attenuator 11 (or variable gain preamplifier) in such a way as to keep the loop in equilibrium (i.e., the servo loop is "closed" or "locked"). The output of the amplifier is consequently at the desired power level.

Since radio equipments may warm up or cool down over time from self heating or from a change in the ambient conditions, it may be necessary to update the voltage $V_t$ occasionally. This is accomplished by first opening the electronic switch 26 so that the loop control voltage is held constant in S/H circuit 25. The amplifier 10 is then momentarily shut down by opening switch 27 so that the detector voltage can revert back to $V_t$ from $(V_p+V_t)$. A new value for $V_t$ is again sampled and stored in S/H circuit 23 by setting electronic switch 22 to output position A. Next, the electronic switch 22 is reset to output position B, the amplifier 10 is turned back on by closing switch 27, and finally electronic switch 26 is closed. The system again functions as a normal closed loop amplifier thereafter until the time it is deemed necessary to update the diode thermal data again. The reason the S/H circuit 25 is needed is to provide a clean return of the RF power after the amplifier is momentarily turned off. Without S/H circuit 25, loop transients may occur when the amplifier is turned back on causing overshoots in the RF power.

In the land-mobile communication applications, a very short, temporary shut off of the RF transmission has a negligible effect on the communication link, be it voice or data communication. An occasional suppression of the transmit energy of less than one millisecond, even if it occurs in the middle of a speech, is virtually imperceptible after demodulation at the receiving end. This compares to typical and frequent fading associated with land mobile communications lasting tens of milliseconds or more. To further mitigate the effect, it is preferred that, in operation, the system will detect a pause in the speech (in voice communication) or an absence in data modulation (in data communication) by means such as a voice-activated-transmit (VOX) type of speech detection circuit and triggers a diode thermal data update sequence.

Figure 3:
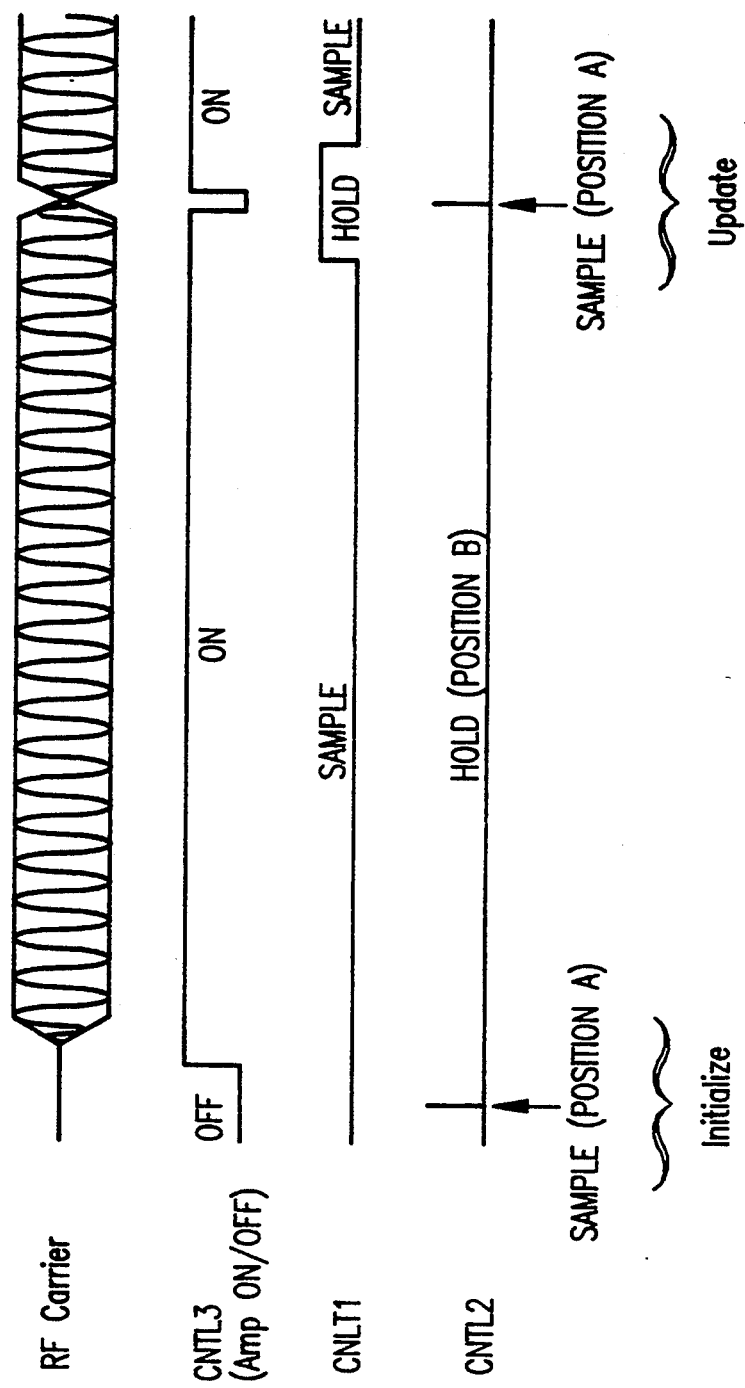
FIG. 3 is a timing diagram illustrating the operation of the power level control circuit shown in FIG. 2.

The sequence of events for initializing and updating of diode thermal data is shown in FIG. 3. A typical rate of update for land-mobile type of radio equipments need not be any more frequent than once every 3 to 5 minutes. Initially, switch 27 is off and then turned on by CNTL3. During the initialization phase while switch 27 is off, switch 22 is momentarily switched to output position A by CNTL2. During the initialization phase and subsequent operation of the circuit, switch 26 is held in the closed, or sample, position by CNTL1. Now, when there is detected an absence of data modulation as indicated in the null in the RF carrier, CNTL1 causes switch 26 to open so as to hold the last value output by the comparator 14. During the time that the CNTL1 is active (i.e., HOLD), CNTL3 turns amplifier 10 off via switch 27, and while amplifier 10 is off, CNTL2 again causes switch 22 to switch to the sample output position A to update the value $V_t$ held by S/H circuit 23.

Figure 4:
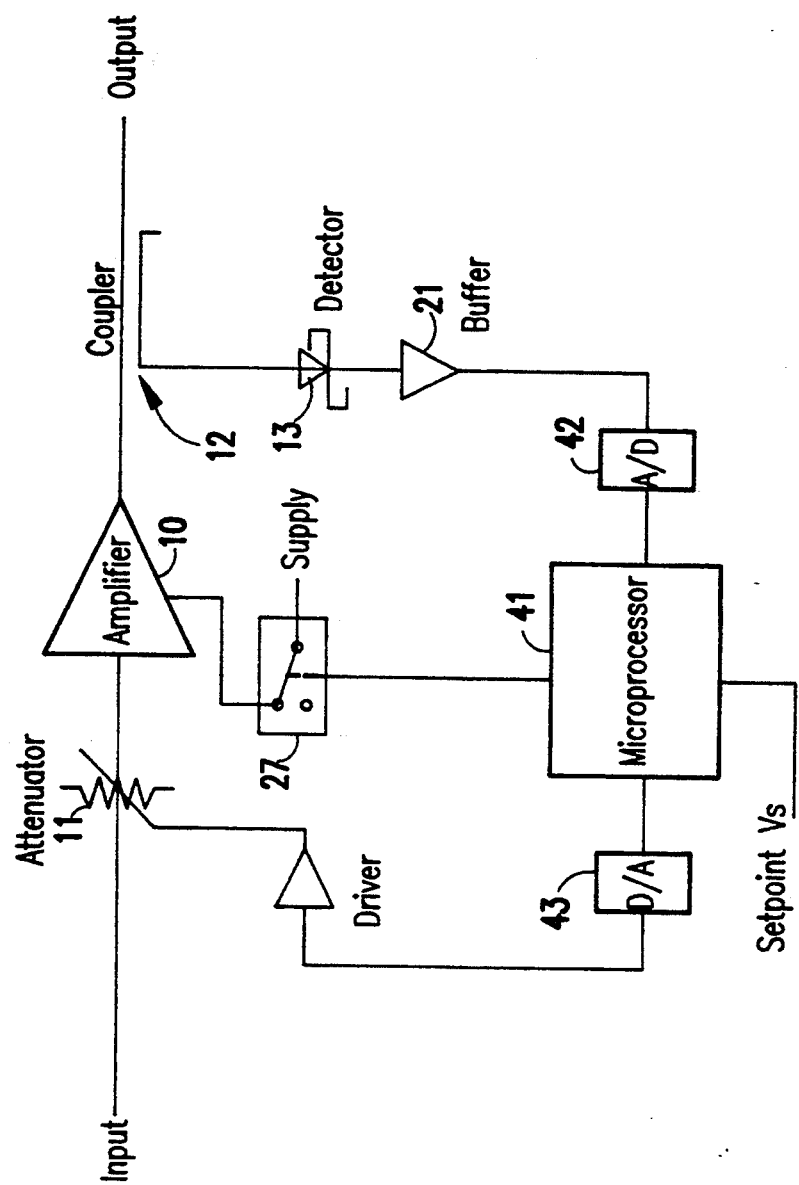
FIG. 4 is a block diagram of a second embodiment of the power level control circuit according to the invention.
Figure 5:
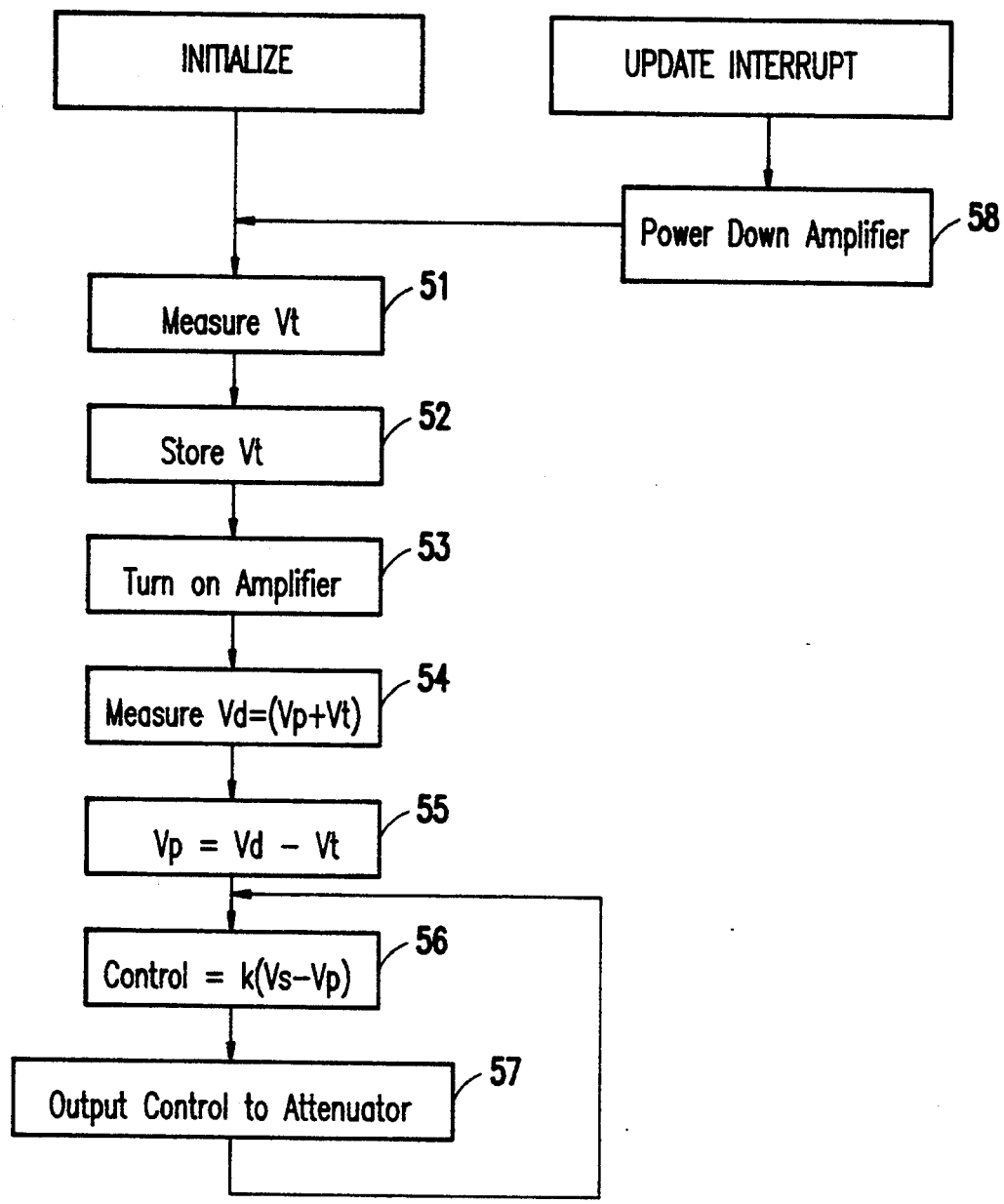
FIG. 5 is a flowchart showing the logic of the control program implemented on the microprocessor shown in the FIG. 4 embodiment.

A digital embodiment implementing the same method is shown in FIG. 4. In this embodiment, a microprocessor 41, including digital memory, supporting registers and control firmware, receives as an input the setpoint control signal and operates to control the power to amplifier 10 via switch 27. Here, the use of digital memory in the microprocessor implementation replaces the analog memories associated with S/H circuits of the embodiment shown in FIG. 2. The diode detector voltage is digitized by a analog-to-digital (A/D) converter 42. The values of $V_p$ and $V_t$ are converted to binary values that will be processed by the microprocessor 41 in a similar fashion as the analog embodiment counterpart. After processing a proportional control algorithm, the logic of which is shown in FIG. 5, the control value is output to a digital-to-analog (D/A) converter 43 for driving the attenuator 11 (or, alternatively, a variable gain preamplifier) to set the proper overall gain in order to achieve the desired output power setting. The loop processes continuously until it is interrupted for a diode thermal data $V_t$ update by the microprocessor 41.

With reference to FIG. 5, there are two inputs to the flow, initialize and update interrupt, just as in the analog counterpart. Beginning first with the initialize input, the value Vt is first measured at function block 51 with the amplifier 10 off. This value is digitized by A/D converter 42 and stored in the microprocessor memory at function block 52. Next, the microprocessor 41 turns on the amplifier 10 via switch 27 in function block 53. Now, the value $V_d$, which is the sum of $V_p$ and $V_t$, is measured and digitized in function block 54. The microprocessor 41 subtracts the stored value of $V_t$ from $V_d$ to obtain the value $V_p$ in function block 55. This computed value of $V_p$ is compared by the microprocessor 41 to the setpoint value $V_s$ to generate a control value in function block 56. This control value is then convened to an analog voltage by D/A converter 43 to generate a control voltage to the attenuator 11 (or variable gain preamplifier) in function block 57.

The other input to the flow is an update interrupt to the microprocessor 41. This interrupt may be generated either by the detection of an absence in data modulation or speech or a timeout (set for between 3 and 5 minutes, for example), whichever comes first. The timeout is automatically reset by the microprocessor as part of the interrupt handling process. In response to the update interrupt, the microprocessor 41 powers down the amplifier 10 by opening switch 27 at function block 58. The process then goes to function block 51 and continues as described above.

While the invention has been described in terms of two preferred embodiments, one analog and the other digital, those skilled in the art will recognize that the invention can be practiced with modification within the spirit and scope of the appended claims.

Having thus described our invention, what we claim as new and desire to secure by Letters Patent is as follows:

1. A method of controlling the output power of an amplifier having a negative feedback control system, comprising the steps of:
    detecting a thermally induced voltage, $V_t$, within the feedback control system;
    detecting an amplifier power indicating voltage $V_d$, within the feedback control system;
    using $V_t$ and $V_d$ to obtain a true power indicating voltage, $V_p$;
    comparing $V_p$ with a preset control voltage, $V_s$, and adjusting an input signal level to set a proper overall gain to achieve a desired output power of the amplifier based on a result of the comparison of $V_p$ and $V_s$; and storing the detected thermally induced voltage, $V_t$; and periodically updating the stored thermally induced voltage, $V_t$.

2. A method of controlling the output power of an amplifier having a negative feedback control system, comprising the steps of:
    detecting a thermally induced voltage, $V_t$, within the feedback control system;
    detecting an amplifier power indicating voltage $V_d$, within the feedback control system;
    using $V_t$ and $V_d$ to obtain a true power indicating voltage, $V_p$;
    comparing $V_p$ with a preset control voltage, $V_s$, and adjusting an input signal level to set a proper overall gain to achieve a desired output power of the amplifier based on a result of the comparison of $V_p$ and $V_s$; and storing the detected thermally induced voltage, $V_t$; and
    periodically shutting down the amplifier;
    detecting a new thermally induced voltage $V_t$; and
    storing the detected new thermally induced voltage, $V_t$.

3. A method of controlling an output power level of an amplifier to render the amplifier insensitive to temperature variations, comprising the steps of:
    measuring a thermally induced detector voltage, $V_t$, within a feedback circuit of the amplifier, prior to powering up the amplifier;
    storing $V_t$;
    powering up the amplifier;
    measuring a detector voltage, $V_d$, which equals a true amplifier power indicating voltage, $V_p$, plus the thermally induced voltage. $V_t$;
    using $V_t$ and $V_d$ to determine the true amplifier power indicating voltage, $V_p$;
    comparing $V_p$ against a set point voltage, $V_s$, representing a desired output power;
    determining a difference between the set point voltage, $V_s$, and the true amplifier power indicating voltage, $V_p$;
    using the difference between the set point voltage, $V_s$, and the true amplifier power indicating voltage, $V_p$, to adjust an input signal to the amplifier and thereby effect control of output power of the amplifier and making the amplifier insensitive to temperature variation.

4. The method of controlling an output power level of an amplifier recited in claim 3, further comprising the steps of:
    momentarily shutting down the amplifier;
    measuring a new thermally induced voltage, $V_t$, while the amplifier is shut down;
    storing the new $V_t$;
    powering up the amplifier; and
    using the new $V_t$ and $V_d$ to determine the true amplifier power indicating voltage $V_p$.

5. A thermally stable automatically regulated power amplifier including a negative feedback system, comprising:
    detecting means, within the feedback system, for detecting a thermally induced voltage, $V_t$, prior to powering up the amplifier;
    storing means, within the feedback system, for storing the detected thermally induced voltage, $V_t$;
    control means for powering up the amplifier, said detecting means thereafter detecting an amplifier power indicating voltage, $V_d$;
    combining means, within the feedback system, for combining the stored $V_t$ and $V_d$ to obtain a true power indicating voltage, $V_p$;
    comparing means, within the feedback system, for comparing $V_p$ with a preset control voltage, $V_s$; and
    level adjusting means responsive to said comparing means for adjusting an input signal to the amplifier based on the result of the comparison of $V_p$ and $V_s$ and thereby effect control of the output power of the amplifier making the amplifier insensitive to temperature variation.

6. The thermally stable automatically regulated power amplifier of claim 5, further comprising:
    second storing means for temporarily storing an output of said comparing means when said amplifier is shut down; and
    command means for periodically shutting down the amplifier and updating the stored thermally induced voltage, $V_t$.

7. The thermally stable automatically regulated power amplifier of claim 6, wherein the means for storing the thermally induced voltage, $V_t$, is a sample-and-hold circuit.

8. The thermally stable automatically regulated power amplifier of claim 5, wherein the storing, control, combining and comparing means are a microprocessor including digital memory, supporting registers and control firmware, further comprising:
    an analog-to-digital converter for converting detected voltages $V_t$ and $V_d$ to digital values for storing in the digital memory of the microprocessor; and
    a digital-to-analog converter for converting the result of the comparison of $V_p$ and $V_s$ to an analog control voltage for controlling the level adjusting means.

* * * * *